(12) United States Patent
Ozawa (10) Patent No.: US 8,377,557 B2
(45) Date of Patent: Feb. 19, 2013

(54) THERMALLY CONDUCTIVE SHEET COMPOSITE AND METHOD FOR MANUFACTURING THE SAME

(75) Inventor: Motoki Ozawa, Yokohama (JP)

(73) Assignee: Polymatech Co., Ltd., Tokyo (JP)

( * ) Notice: Subject to any disclaimer, the term of this patent is extended or adjusted under 35 U.S.C. 154(b) by 400 days.

(21) Appl. No.: 12/456,964

(22) Filed: Jun. 25, 2009

(65) Prior Publication Data
US 2010/0009109 A1    Jan. 14, 2010

(30) Foreign Application Priority Data
Jul. 11, 2008 (JP) .................................. 2008-181315

(51) Int. Cl.
B32B 9/04       (2006.01)
B32B 5/16       (2006.01)

(52) U.S. Cl. ..................................... 428/411.1; 428/323

(58) Field of Classification Search .................. None
See application file for complete search history.

(56) References Cited

U.S. PATENT DOCUMENTS

| | | | |
|---|---|---|---|
| 6,531,017 B1 * | 3/2003 | Fukui et al. ................... | 156/235 |
| 6,831,031 B2 * | 12/2004 | Ishihara ........................ | 501/96.4 |
| 2004/0142511 A1 * | 7/2004 | Yamashita et al. ............ | 438/118 |
| 2005/0079328 A1 * | 4/2005 | Mizutani et al. ............ | 428/195.1 |
| 2006/0063017 A1 * | 3/2006 | Funahashi ..................... | 428/500 |
| 2007/0153453 A1 * | 7/2007 | Wang et al. ................... | 361/679 |
| 2008/0101781 A1 * | 5/2008 | Muller .......................... | 392/479 |
| 2009/0306306 A1 | 12/2009 | Ohkido et al. | |

FOREIGN PATENT DOCUMENTS

| | | |
|---|---|---|
| EP | 0799693 A2 | 10/1997 |
| JP | 2-196453 A | 8/1990 |
| JP | 09207275 A | 8/1997 |
| JP | 11-144334 | * 11/1997 |
| JP | 10-183110 A | 7/1998 |
| JP | 11-307697 A | 11/1999 |
| JP | 3072491 U | 8/2000 |
| JP | 3072491 U | 10/2000 |
| JP | 2001294676 A | 10/2001 |
| JP | 2001341233 A | 12/2001 |
| JP | 2002113816 A | 4/2002 |
| JP | 2003133491 | * 5/2003 |
| JP | 2007308676 A | 11/2007 |

OTHER PUBLICATIONS

Shimizu Norikazu, JP 11-144337 machine translation, Nov. 11, 1997.*
Ishikawa, JP 2003-133491 machine translation, May 9, 2003.*
Polymeric Biomaterials, p. 312—Table 13.1, 2002. http://books.google.com/books?id=iCm1SJBDZwkC&pg=PA312&lpg=PA312&dq=elastomer+EVA&source=bl&ots=0ZkWglCtAy&sig=hutLeGkwtjUHu8D60EAPf0hRSv8&hl=en&ei=xSVRTrSoDKb40gH7zZXzDw&sa=X&oi=book_result&ct=result&resnum=6&ved=0CEgQ6AEwBQ#v=onepage&q=elastomer%20EVA&f=false.*
Automotive Insulation (Ailcc), EPDM rubber, http://www.ailcc.org/epdm-rubber.html , Retrieved on Aug. 21, 2011.*

* cited by examiner

Primary Examiner — Callie Shosho
Assistant Examiner — Coris Fung
(74) Attorney, Agent, or Firm — Seager, Tufte & Wickhem LLC (57) ABSTRACT

A thermally conductive sheet composite comprises a gelatinous thermally conductive sheet molded of a thermally conductive polymer composition containing a polymeric material and a thermally conductive filler, and a release sheet molded separately from the thermally conductive sheet and peelably laminated on at least one surface of a pair of surfaces of the thermally conductive sheet. The release sheet has a hardness of 30 or more as measured by a type A durometer in conformity with ISO 7619.

4 Claims, 8 Drawing Sheets
(3 of 8 Drawing Sheet(s) Filed in Color)

THERMALLY CONDUCTIVE SHEET COMPOSITE AND METHOD FOR MANUFACTURING THE SAME

BACKGROUND OF THE INVENTION

The present invention relates to a thermally conductive sheet used for a countermeasure against heat of electronic components, particularly to a thermally conductive sheet composite and a method of manufacturing the thermally conductive sheet composite of which consideration is given to the delivery form and the ease of handling of the thermally conductive sheet.

For example, on electronic components such as CPUs mounted on electronic devices, a heat radiating body such as a heat sink is installed in order to cool the electronic components, which are heat generating bodies. In order to promote thermal conduction from a heat generating body to a heat radiating body, a thermally conductive sheet is sandwiched between the heat generating body and the heat radiating body. Utilization of a thermally conductive sheet increases the thermal conduction area between a heat generating body and a heat radiating body, and allows heat to escape from the heat generating body to the heat radiating body.

In a thermally conductive sheet, the conformability and adhesion to a heat generating body and a heat radiating body decrease the thermal resistance value, which is an index indicating the unlikeliness of heat transfer, thereby improving the thermal conduction performance. From this viewpoint, more flexible thermally conductive sheets are preferably used. However, a more flexible thermally conductive sheet exhibits a higher adhesion. Therefore, in some cases, sheets are adhered to each other when a plurality of the sheets are stored in a stacked state, and attaching work of a sheet on a heat generating body involves a difficulty due to the adhesion of the sheet. On the other hand, a thermally conductive sheet that is thinner gives a more improved thermal conduction. From this viewpoint, thinner thermally conductive sheets are preferably used. However, making thinner the shape of thermally conductive sheets having the flexibility and adhesion results in further decrease in the ease of handling of the thermally conductive sheets.

For example, Japanese Laid-Open Patent Publication No. 2-196453 discloses a thermally conductive sheet composite provided with a first silicone resin layer that is easily deformable and a second silicone resin layer that is laminated on the first silicone resin layer and has a strength necessary for handling. Japanese Laid-Open Patent Publication No. 10-183110 discloses a manufacturing method of a thermally conductive sheet composite obtained by preparing a pair of resin films whose surfaces are coated with a rubber composition, sandwiching a silicone gel blended with a thermally conductive filler between the films, further rolling both films between a pair of rolls, and finally curing them through a heating furnace. The thermally conductive sheet has a rubbery thin film reinforcing layer on at least one surface thereof. Japanese Laid-Open Patent Publication No. 11-307697 discloses a thermally conductive sheet composite provided with a silicone rubber layer A containing a thermally conductive filler and having a Shore A hardness of 20 or more, and a silicone rubber layer B containing a thermally conductive filler and having an Asker C hardness of 30 or less.

Additionally, from the viewpoint of manufacture, transportation, attachment and the like, a thermally conductive sheet composite containing a gelatinous thermally conductive sheet and resin films laminated on both surfaces of the thermally conductive sheet is commercially available. When using a thermally conductive sheet composite of such a type, the resin films are peeled off the thermally conductive sheet at the point of use and only the thermally conductive sheet can be pasted on the surface of a heat generating body or a heat radiating body. Therefore, the gelatinous thermally conductive sheet can bring the heat generating body and the heat radiating body into close contact, and provide excellent thermal conduction and low thermal resistance.

However, the sheet composites disclosed in the documents described above are formed by simultaneously molding and curing a gelatinous thermally conductive sheet and a rubbery reinforcing sheet for reinforcing the thermally conductive sheet. That is, since the thermally conductive sheet and the reinforcing sheet constituting the sheet composite are integrated, the reinforcing sheet cannot be peeled off the thermally conductive sheet at the point of use. Therefore, since these thermally conductive sheet composites have excellent ease of handling, but by contrast, have low adhesion to a heat generating body and a heat radiating body, there is a room for improvement in their thermal conduction.

Figure 11A:
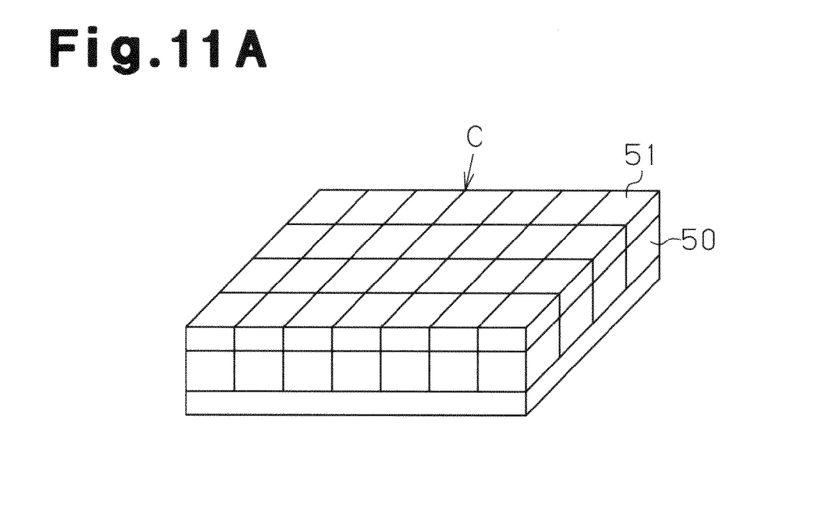
FIG. 11A is a perspective view showing a conventional thermally conductive sheet composite after being cut.
Figure 11B:
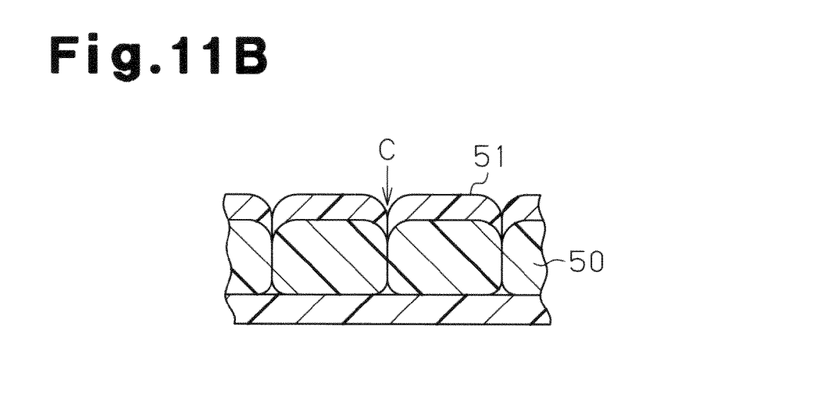
FIG. 11B is a partial cross-sectional view showing a thermally conductive sheet composite after being cut.

As sheet composites used by peeling a resin film off, ones which are formed as a relatively large area sheet material, and cut into a predetermined shape and size depending on applications are provided from the viewpoint of productivity, mass productivity and the like. In this case, a gelatinous thermally conductive sheet is cut into a predetermined shape and size together with a resin film by using a cutter or the like. However, when using a sheet composite of such a type, if the hardness of the thermally conductive sheet is made further low in order to improve the adhesion to a heat generating body or a heat radiating body, the gelatinous thermally conductive sheet together with the resin film is difficult to cut. Specifically, as shown in FIGS. 11A and 11B, if a thermally conductive sheet 50 is cut together with a resin film 51, the flexibility of the thermally conductive sheet 50 causes the thermally conductive sheet 50 to be crushed along its cut portions C. This varies the shapes of the end parts of the thermally conductive sheet 50, which may cause errors in sizes such as area and thickness of the thermally conductive sheet 50 after being cut.

Other than sheet composites described above, a constitution is conceivable in which a gelatinous thermally conductive sheet is previously cut into a predetermined shape and size according to applications and the thermally conductive sheet after being cut is pasted on a release sheet. However, such a constitution takes much labor for cutting of the thermally conductive sheet, pasting it to a release sheet and the like, and requires much time, which may increase the manufacturing costs.

SUMMARY OF THE INVENTION

It is an objective of the present invention to provide a thermally conductive sheet composite more easily usable in applications to thermal conduction from a heat generating body to a heat radiating body, and a method for manufacturing the same.

To achieve the foregoing objective and in accordance with a first aspect of the present invention, a thermally conductive sheet composite including a gelatinous thermally conductive sheet and a release sheet is provided. The gelatinous thermally conductive sheet is molded of a thermally conductive polymer composition containing a polymeric material and a thermally conductive filler. The release sheet is molded separately from the thermally conductive sheet and peelably laminated on at least one surface of a pair of surfaces of the thermally conductive sheet. The release sheet has a hardness of 30 or more as measured by a type A durometer in conformity with ISO 7619.

In accordance with a second aspect of the present invention, a method for manufacturing a thermally conductive sheet composite is provided. The method includes: preparing a thermally conductive polymer composition containing a polymeric material and a thermally conductive filler; molding the polymer composition into a sheet shape to form a gelatinous thermally conductive sheet; separately from the molding of the thermally conductive sheet, forming a release sheet having a hardness of 30 or more as measured by a type A durometer in conformity with ISO 7619; and laminating the release sheet on at least one surface of the pair of surfaces of the thermally conductive sheet.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

Hereinafter, a thermally conductive sheet composite of the present invention and a manufacturing method according to one embodiment of the present invention will be described with reference to drawings.

Figure 1A:
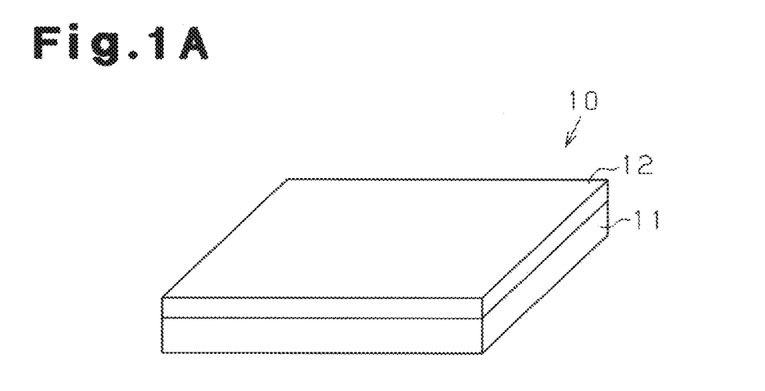
FIG. 1A is a perspective view of a thermally conductive sheet composite according to one embodiment of the present invention.
Figure 1B:
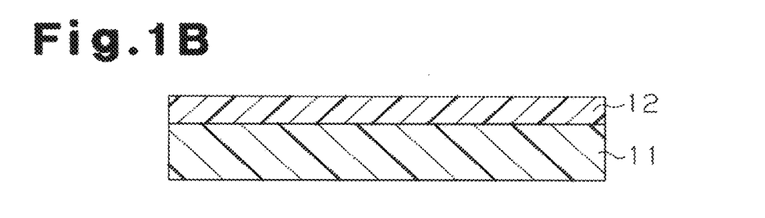
FIG. 1B is a cross-sectional view of the thermally conductive sheet composite.

As shown in FIG. 1, a thermally conductive sheet composite 10 is provided with a thermally conductive sheet 11 and a release sheet 12. The thermally conductive sheet 11 is sandwiched between a heat generating body such as an electronic component and a heat radiating body such as a heat sink to promote thermal conduction from the heat generating body to the heat radiating body.

The thermally conductive sheet 11 is formed in a gelatinous state of a thermally conductive polymer composition containing a polymeric material and a thermally conductive filler. The polymeric material holds the thermally conductive filler in the thermally conductive sheet 11. The thermally conductive filler being contained in the polymeric material enhances the thermal conductivity of the thermally conductive sheet 11. "Gelatinous state" used here refers to a resin material having a hardness of less than 5, as measured by a type E durometer in conformity with ISO 7619, which is one of the Japanese Industrial Standards.

A polymeric material to form the thermally conductive sheet 11 is selected according to required properties, for example, mechanical strength and thermal resistance. As a polymeric material, for example, a rubber and a thermoplastic elastomer are used because these have a high conformability to shapes of a heat generating body and a heat radiating body in addition to the required properties. The rubbers specifically include natural rubber, butadiene rubber, isoprene rubber, styrene-butadiene copolymerized rubber, nitrile rubber, hydrogenated nitrile rubber, chloroprene rubber, ethylene-propylene copolymerized rubber, chlorinated polyethylene rubber, chlorosulfonated polyethylene rubber, butyl rubber, halogenated butyl rubber, fluororubber, urethane rubber, silicone rubber, polyisobutylene rubber, and acrylic rubber. The thermoplastic elastomers specifically include styrenic thermoplastic elastomers, olefinic thermoplastic elastomers, polyester thermoplastic elastomers, and polyurethane thermoplastic elastomers. As a polymeric material, only one of these specific examples may be used singly, or these may be used in a combination of two or more.

The thickness of the thermally conductive sheet 11 is not particularly limited, but is preferably 0.05 mm to 5 mm, and more preferably 0.05 mm to 2.0 mm. With the thickness of the thermally conductive sheet 11 of less than 0.05 mm, since molding in a sheet shape is difficult, the productivity may decrease and the manufacturing cost may be increased. With the thickness of the thermally conductive sheet 11 exceeding 5 mm, since the thermal resistance in the thickness direction of the sheet increases, a desired thermal conduction may not be provided. Further, since the mass per unit area of the thermally conductive sheet 11 increases, the manufacturing cost may be increased due to an increase in the material cost. Thus, the weights of electronic components on which the thermally conductive sheet 11 is pasted, and the weights of electronic devices mounting the electronic components may increase. As described above, by setting the thickness of the thermally conductive sheet 11 at 0.05 mm to 2.0 mm, the thermal resistance value of the thermally conductive sheet 11 can be decreased to a desired value.

The thermally conductive fillers to form the thermally conductive sheet 11 include, for example, powders of metal oxides, metal nitrides, metal carbides, and metal hydroxides. The thermally conductive fillers specifically include powders of aluminum oxide, boron nitride, aluminum nitride, magnesium oxide, zinc oxide, silicon carbide, quartz, and aluminum hydroxide, Further, the thermally conductive fillers also include powders of carbon fibers, diamond, graphite, and aluminum, which have an electric conduction in addition to a high thermal conduction. As a thermally conductive filler, only one of these specific examples may be used singly, or these may be used in a combination of two or more.

As described above, since the thermally conductive sheet 11 is gelatinous, it is very flexible, and has a property of being difficult to handle on transportation and attaching work. Then, the thermally conductive sheet composite 10 according to the present embodiment is provided with the release sheet 12 having a predetermined hardness on one surface of a pair of opposite surfaces of the thermally conductive sheet 11. The release sheet 12 reinforces the gelatinous thermally conductive sheet 11, and is cut together with the thermally conductive sheet 11 additionally to facilitate cutting of the thermally conductive sheet 11. Hereinafter, in describing the thermally conductive sheet composite 10, one surface on which the release sheet 12 is disposed out of the pair of surfaces of the thermally conductive sheet 11 is described as a first surface; and the surface on the opposite side to the first surface is described as a second surface.

The release sheet 12 comprises a sheet material molded separately from the thermally conductive sheet 11. The release sheet 12 is peelably laminated on the first surface of the thermally conductive sheet 11. The release sheet 12 is held on the first surface of the thermally conductive sheet 11 only by the adhesion of the thermally conductive sheet 11. If the release sheet 12 cannot be easily peeled off due to the adhesion of the thermally conductive sheet 11, unevenness may be provided on the facing surface of the release sheet 12 to the thermally conductive sheet 11.

In the present embodiment, the thermally conductive sheet composite 10 has a feature that the release sheet 12 has a hardness of 30 or more, as measured by a type A durometer in conformity with ISO 7619, which is one of the Japanese Industrial Standards. In the case where the release sheet 12 has a hardness of 30 or more, as measured by a type A durometer, since the release sheet 12 can fully reinforce the gelatinous thermally conductive sheet 11, the thermally conductive sheet composite 10 can be easily handled and the thermally conductive sheet 11 can be easily cut. In the case where the release sheet 12 has a hardness of less than 30, as measured by a type A durometer, since the release sheet 12 cannot fully reinforce the gelatinous thermally conductive sheet 11, the thermally conductive sheet composite 10 is difficult to handle. Further, since the adhesion of the release sheet 12 is high, cutting the thermally conductive sheet 11 together with the release sheet 12 is also difficult.

As the release sheet 12, the following three types of sheet materials can be used. A first mode thereof is the release sheet 12 formed of a sheet material containing only a base material composed of an elastic material. A second mode is the release sheet 12 formed of a sheet material containing a base material composed of an elastic material, and a brittleness imparting material to make the base material brittle. Then, a third mode is the release sheet 12 formed of a sheet material containing a base material composed of a resin material, and a brittleness imparting material to make the base material brittle. The brittleness imparting material is contained in order to make brittle a base material composed of an elastic material or a resin material. That is, since containing a brittleness imparting material decreases the tensile strength, the tear strength and the like, which are intrinsic to a base material, the release sheet 12 can easily be cut, and in its turn, the thermally conductive sheet 11 can be more easily cut.

Elastic materials as a base material include, for example, elastic materials such as rubbers and thermoplastic elastomers. The rubbers specifically include natural rubber, butadiene rubber, isoprene rubber, styrene-butadiene copolymerized rubber, nitrile rubber, hydrogenated nitrile rubber, chloroprene rubber, ethylene-propylene copolymerized rubber, chlorinated polyethylene rubber, chlorosulfonated polyethylene rubber, butyl rubber, halogenated butyl rubber, fluororubber, urethane rubber, silicone rubber, polyisobutylene rubber, and acrylic rubber. The thermoplastic elastomers specifically include styrenic thermoplastic elastomers, olefinic thermoplastic elastomers, polyester thermoplastic elastomers, and polyurethane thermoplastic elastomers. As an elastic material, only one of these specific examples may be used singly, or these may be used in a combination of two or more.

Resin materials usable as a base material are, for example, thermoplastic resin materials, and specifically include polyester resins, polyolefin resins, polycarbonate resins, and polyamide resins. The polyester resins specifically include PET (polyethylene terephthalate) and polybutylene terephthalate resins. The polyolefin resins specifically include polypropylene, polyethylene, and olefinic thermoplastic elastomers. The polyamide resins include polyamide 6, polyamide 66, polyamide 11, polyamide 12, amorphous polyamide, and polymethacrylimide. As a resin material, only one of these specific examples may be use singly, or these may be used in a combination of two or more.

Brittleness imparting materials usable are inorganic particle powder such as talc, silica, diatomaceous earth, iron oxide, zinc oxide, titanium oxide, barium oxide, magnesium oxide, calcium carbonate, magnesium carbonate, thermally conductive fillers, and glass beads, organic particles such as acryl beads, styrene beads, and silicone beads, and photolysis accelerators. In the case where inorganic particles or organic particles are used as a brittleness imparting material, the particle diameter is preferably in the range of 1 µm to 200 µm. With the particle diameter of less than 1 µm, the base material of the release sheet 12 cannot be made sufficiently brittle. With the particle diameter exceeding 200 µm, molding the release sheet 12 having desired properties is difficult. Specifically, the release sheet 12 cannot be imparted a reasonable flexibility, resulting in formation of the release sheet 12 which easily generates cracks on bending.

A thermally conductive filler used as a brittleness imparting material may be the same as a thermally conductive filler contained in the thermally conductive sheet 11. However, in this case, it is sufficient if a base material such as an elastic material or a resin material can be made brittle, so the content of the thermally conductive filler may be less than the amount contained in the thermally conductive sheet 11. Further, a release sheet may be used which is obtained by blending two or more types of incompatible polymers in order to increase the brittleness more than a release sheet composed of a single constituent polymer (base material) alone. In this case, out of the two or more types of incompatible polymers, at least one type of the constituent polymers functions as a brittleness imparting material.

The thickness of the release sheet 12 is not particularly limited, but is preferably 0.05 mm to 0.2 mm. With the thickness of the release sheet 12 of less than 0.05 mm, since the shape of the release sheet 12 is too thin, the release sheet 12 cannot be easily peeled off the thermally conductive sheet 11, which may pose a problem for pasting work of the thermally conductive sheet 11. With the thickness of the release sheet 12 exceeding 0.2 mm, since the release sheet 12 cannot provide a sufficient flexibility, the release sheet 12 is likely to be difficult to peel off the thermally conductive sheet 11. Further, in order that the release sheet 12 can easily be peeled off the thermally conductive sheet 11, a well-known release agent may be applied to the first surface of the release sheet 12. The release agents usable are, for example, fluororesin-based release agents, silicone oil-based release agents, and ionic and non-ionic surfactants.

The thermally conductive sheet composite 10 described above is manufactured through steps as follows.

First, a polymeric material and a thermally conductive filler are mixed to prepare a thermally conductive polymer composition.

Figure 2A:
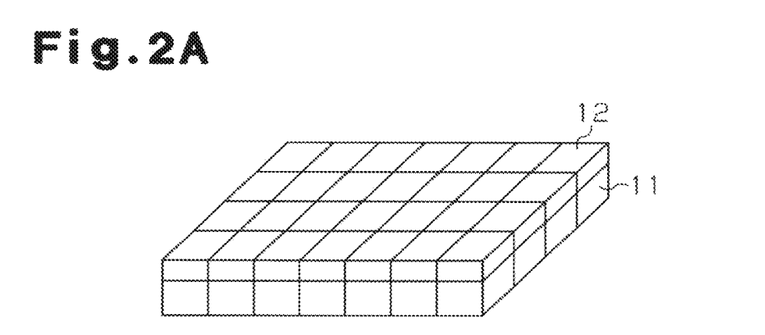
FIG. 2A is a perspective view showing the thermally conductive sheet composite after being cut.
Figure 2B:
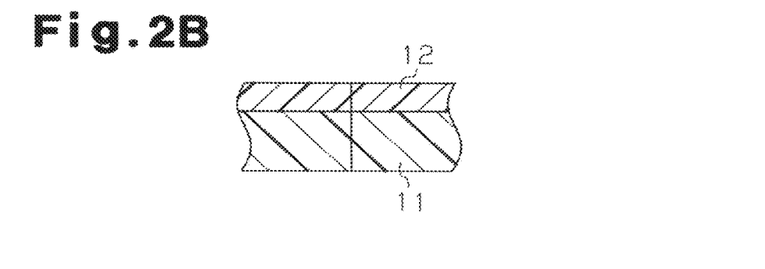
FIG. 2B is a partial cross-sectional view showing the thermally conductive sheet composite after being cut.

Then, using the obtained polymer composition, a sheet material having a relatively large area is molded. Thereby, a gelatinous thermally conductive sheet 11 is formed. Methods for molding a sheet material specifically include press molding, a bar coater method, a doctor blade method, a comma coater method, calender molding, and extrusion molding by a T-die. Separately from the formation of the thermally conductive sheet 11, the release sheet 12 is formed using the same method as for the thermally conductive sheet 11. Specifically, a material to form a base material and as required, a brittleness imparting material are mixed and a sheet material having the nearly same area as the thermally conductive sheet 11 is molded by using any of the known methods above. Then, the release sheet 12 is laminated on the first surface of the thermally conductive sheet 11. Thereby, the release sheet 12 is adhered to the first surface of the thermally conductive sheet 11 to fabricate a thermally conductive sheet composite 10. The thermally conductive sheet composite 10, as shown in FIGS. 2A and 2B, is cut into a predetermined shape and size to applications by using a cutter, scissors or the like. At this time, the thermally conductive sheet 11 is cut together with the release sheet 12. When the thermally conductive sheet composite 10 is manufactured in a mass production, the composite can be cut into a predetermined shape and size using a cutting machine equipped with pressured cutting blade or a shearing blade.

The present embodiment provides the advantages as follows.

(1) The thermally conductive sheet composite 10 comprises the gelatinous thermally conductive sheet 11 and the release sheet 12 laminated on the first surface of the thermally conductive sheet 11 and having a hardness of 30 or more as measured by a type A durometer in conformity with ISO 7619. According to this constitution, as shown in FIGS. 2A and 2B, the thermally conductive sheet 11 can easily be cut together with the release sheet 12. That is, as in a sheet composite shown in FIG. 11, a thermally conductive sheet 50 is crushed along its cut portions C, but in the constitution of the present embodiment, the crushing is inhibited. Therefore, no variation is caused in the shapes of edges of the thermally conductive sheet 11, therefore not causing errors in sizes such as the area and the thickness of the thermally conductive sheet 11 after being cut. Thus, the thermally conductive sheet 11 after being cut is improved in the size precision.

Further, in the case of the thermally conductive sheet composite 10, after the release sheet 12 is peeled off at the point of use, only the thermally conductive sheet 11 is pasted on a heat generating body or a heat radiating body. That is, before the thermally conductive sheet 11 is pasted, the gelatinous thermally conductive sheet 11 has been reinforced with the release sheet 12. After pasted, only the thermally conductive sheet 11 can be sandwiched between the heat generating body and the heat radiating body. Hence, the ease of handling and thermal conduction performance are improved more than for conventional sheet composites in which a thermally conductive sheet and a reinforcing sheet are integrated. Therefore, for applications to thermal conduction from a heat generating body to a heat radiating body, a more easily usable thermally conductive sheet composite 10 can be provided.

(2) As a first mode, the release sheet 12 is formed of a sheet material containing only a base material composed of an elastic material. According to this constitution, since the release sheet 12 has an elasticity by the base material, the release sheet 12 can easily be cut using a cutter, scissors or the like. Therefore, the gelatinous thermally conductive sheet 11 can easily be cut together with the release sheet 12.

(3) As a second mode, the release sheet 12 is formed of a sheet material containing a base material composed of an elastic material and a brittleness imparting material to make the base material brittle. A sheet material containing only a base material composed of an elastic material has an intrinsic tensile strength and tear strength. According to the constitution of the second mode, the brittleness imparting material decreases the tensile strength, tear strength and the like intrinsic to the base material. Thereby, the release sheet 12 can easily be cut, and the thermally conductive sheet 11 is more easily cut.

(4) As a third mode, the release sheet 12 is formed of a sheet material containing a base material composed of a resin material, and a brittleness imparting material to make the base material brittle A sheet material containing only a base material composed of a resin material has an intrinsic tensile strength and tear strength. According to the constitution of the third mode, the brittleness imparting material decreases the tensile strength and tear strength intrinsic to the base material. Thereby, the release sheet 12 can easily be cut, and the thermally conductive sheet 11 is more easily cut.

(5) The thermally conductive sheet composite 10 is manufactured through the steps of preparing a thermally conductive polymer composition comprising a polymeric material and a thermally conductive filler, molding the polymer composition into a sheet shape to form the gelatinous thermally conductive sheet 11, forming a release sheet having a hardness of 30 or more as measured by a type A durometer in conformity with ISO 7619, and laminating the release sheet 12 on at least one surface of a pair of surfaces of the thermally conductive sheet 11. According to this method, for applications to thermal conduction from a heat generating body to a heat radiating body, a more easily usable thermally conductive sheet composite 10 can easily be manufactured.

The embodiment described above may be altered as follows.

Figure 3A:
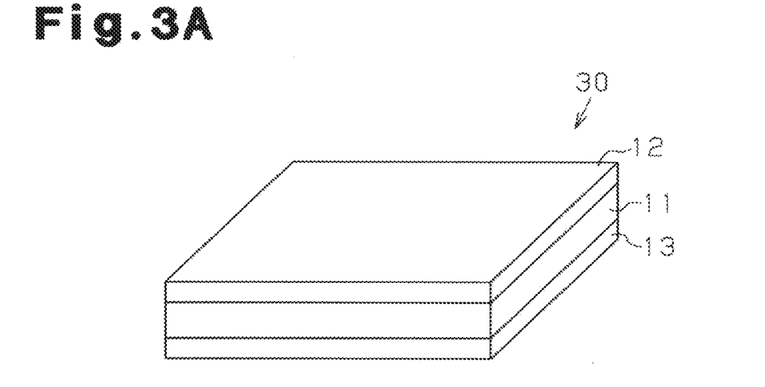
FIG. 3A is a perspective view showing a thermally conductive sheet composite according to a modification of the present invention.
Figure 3B:
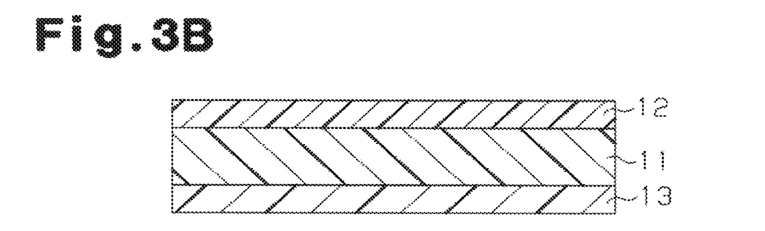
FIG. 3B is a partial cross-sectional view of the thermally conductive sheet composite.

As shown in FIGS. 3A and 3B, a thermally conductive sheet composite 30 may be provided with a reinforcing sheet 13 laminated on the second surface of the thermally conductive sheet 11 in addition to the release sheet 12 laminated on the first surface of the thermally conductive sheet 11. The reinforcing sheet 13 is peelably laminated on the second surface of the thermally conductive sheet 11. Therefore, the release sheet 12 and the reinforcing sheet 13 can be peeled off at the point of use and only the thermally conductive sheet 11 can be sandwiched between a heat generating body and a heat radiating body. The reinforcing sheet 13 is disposed to reinforce the release sheet 12 and together the gelatinous thermally conductive sheet 11. Hence, the reinforcing sheet 13, different from the release sheet 12, does not need to have a property to make cutting of the thermally conductive sheet 11 easy, that is, a property of having a hardness of 30 or more as measured by a type A durometer.

Figure 4A:
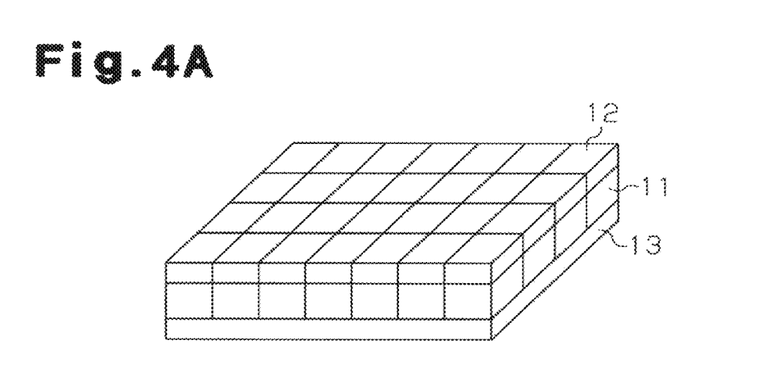
FIG. 4A is a perspective view showing the thermally conductive sheet composite after being cut.
Figure 4B:
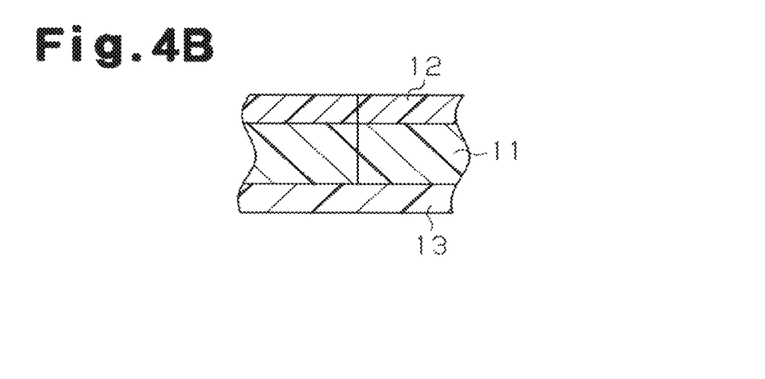
FIG. 4B is a partial cross-sectional view showing the thermally conductive sheet after being cut.

In this case, as the reinforcing sheet 13, for example, a resin-made embossed sheet is used. "Embossed" refers to a pattern which exhibits a three-dimensional appearance in which a sheet material is depressed, and the embossed sheet is molded using a press machine or the like. The reinforcing sheet 13 is preferably an embossed sheet of a polyester resin, a fluorine-processed sheet material, or the like. A sheet material to form the reinforcing sheet 13 usable may be paper and cloth, for example, other than a resin-made sheet. As a cutting method of the thermally conductive sheet composite 30 shown in FIGS. 3A and 3B, as shown in FIGS. 4A and 4B, a "halfway cutting" is suitable in which slits are cut from the release sheet 12 and the cut is made such that the tip of the blade is passed on the surface of the reinforcing sheet 13.

Figure 5A:
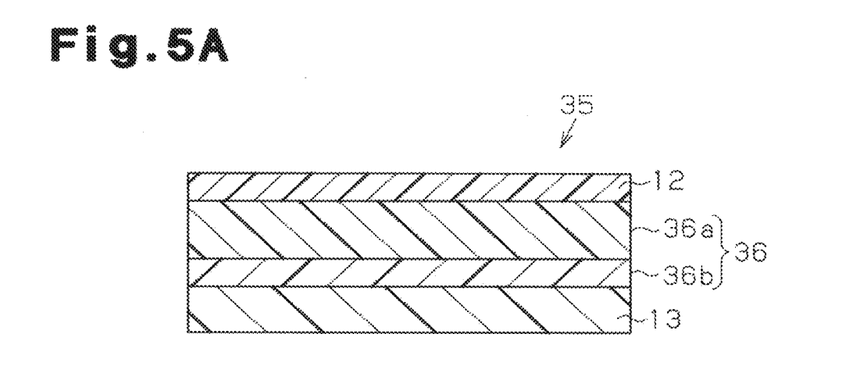
FIG. 5A is a cross-sectional view showing a thermally conductive sheet composite according to a modification of the present invention.
Figure 5B:
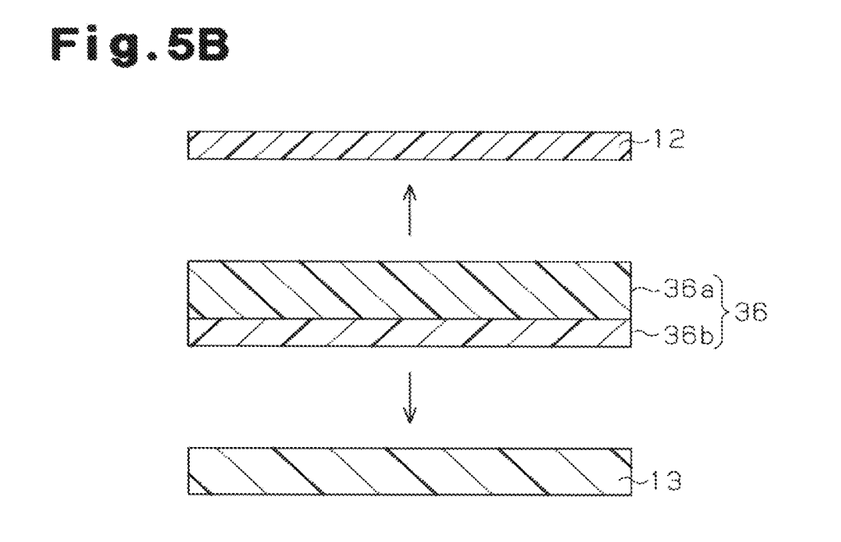
FIG. 5B is a cross-sectional view showing the thermally conductive sheet after a release sheet and a reinforcing sheet are peeled off.

As shown in FIGS. 5A and 5B a thermally conductive sheet 36 constituting a thermally conductive sheet composite 35 may have a two layer structure. Specifically, the thermally conductive sheet composite 35 is provided with the thermally conductive sheet 36, a release sheet 12 laminated on the first surface of the thermally conductive sheet 36, and a reinforcing sheet 13 laminated on the second surface of the thermally conductive sheet 36. The thermally conductive sheet 36 is provided with a gelatinous first layer 36a and a rubbery second layer 36b. The gelatinous first layer 36a is laminated adjacently on the release sheet 12 and the rubbery second layer 36b is laminated adjacently on the reinforcing sheet 13. The rubbery second layer 36b is disposed to make the reinforcing sheet 13 to be easily peeled off the thermally conductive sheet 36. That is, in the case where a gelatinous thermally conductive sheet cannot be easily peeled off a reinforcing sheet, making rubbery the contact surface of the thermally conductive sheet 36 with the reinforcing sheet 13 can make the reinforcing sheet 13 to be easily peeled off the thermally conductive sheet 36.

Figure 6A:
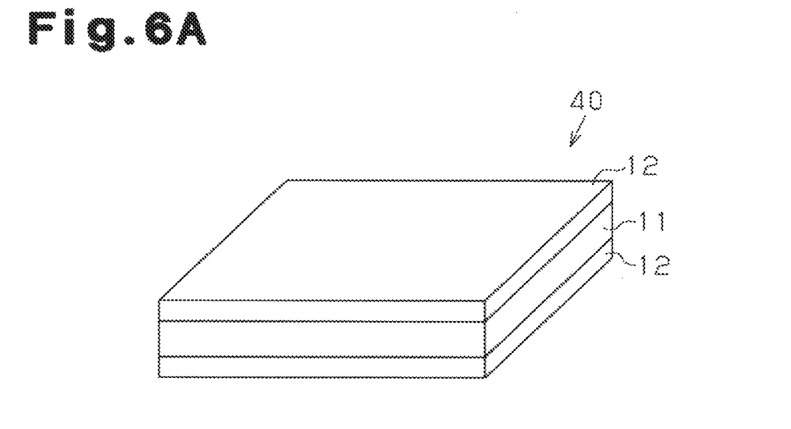
FIG. 6A is a perspective view showing a thermally conductive sheet composite according to a modification of the present invention.
Figure 6B:
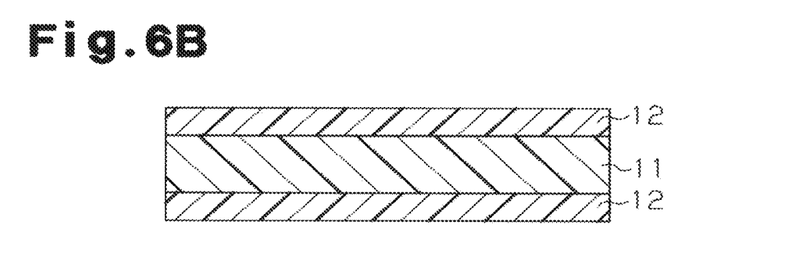
FIG. 6B is a partial cross-sectional view of the thermally conductive sheet composite.

As shown in FIGS. 6A and 6B, a thermally conductive sheet composite 40 may be provided with release sheets 12 on both surfaces of the thermally conductive sheet 11.

EXAMPLES

Hereinafter, the present embodiment will be described more specifically by way of Examples and Comparative Examples.

Example 1

In Example 1, a thermally conductive sheet composite having a constitution shown in FIGS. 3A and 3B was fabricated according to the following steps. In order to fabricate a thermally conductive sheet, first, 100 parts by mass of a liquid silicone polymer as a polymeric material, and aluminum oxide particles as a thermally conductive filler were kneaded for 30 minutes, while being defoamed in a planetary mixer, to prepare a thermally conductive polymer composition. The liquid silicone polymer used was CY52-291, made by Dow Corning Toray Co., Ltd. The aluminum oxide particles used were a mixture of 800 parts by mass of aluminum oxide particles having an average particle diameter of 45 μm, 300 parts by mass of aluminum oxide particles having an average particle diameter of 3 μm and 80 parts by mass of aluminum oxide particles having an average particle diameter of 1.6 μm. The obtained polymer composition was formed into a sheet shape on a sheeting line by a comma coater method, and primarily vulcanized at 120° C. for 10 minutes in a curing furnace. As a result, a gelatinous sheet material (having a thickness of about 1.2 mm) having a hardness of less than 5 (having an E hardness of 0) as measured by a type E durometer was obtained. Thereafter, the sheet material was further secondarily vulcanized at 150° C. for one hour to fabricate a thermally conductive sheet. Then, the obtained thermally conductive sheet was laminated on a polyethylene terephthalate (PET)-made reinforcing sheet (having a thickness of about 200 μm) to fabricate a thermally conductive sheet composite.

Then, in order to fabricate a release sheet, 100 parts by mass of a liquid silicone polymer as a polymeric material and 200 parts by mass of aluminum hydroxide (having an average particle diameter of 50 μm, BW53 made by Nippon Light Metal Co., Ltd.) serving as a brittleness imparting material were kneaded for 30 minutes while being defoamed in a planetary mixer to prepare a polymer composition. At this time, in order to make a release sheet have a desired hardness, the liquid silicone polymer as a polymeric material was blended with predetermined amounts of a curing agent and a catalyst. As in the molding of the thermally conductive sheet, the obtained polymer composition was molded into a sheet shape on a sheeting line by a comma coater method, and vulcanized at 120° C. for 10 minutes. As a result, a sheet material having a hardness of 90 as measured by a type A durometer was obtained. Thereafter, the sheet material was further secondarily vulcanized at 150° C. for one hour to fabricate a release sheet.

Example 2

A thermally conductive sheet composite of Example 2 was the same as the thermally conductive sheet composite of Example 1, except that a release sheet had a different composition. In Example 2, from 100 parts by mass of the liquid silicone polymer and 100 parts by mass of aluminum hydroxide, a release sheet having a hardness of 30 as measured by a type A durometer was fabricated.

Example 3

A thermally conductive sheet composite of Example 3 was the same as the thermally conductive sheet composite of Example 1, except that a release sheet had a different composition. In Example 3, from 100 parts by mass of the liquid silicone polymer and 50 parts by mass of a diatomaceous earth powder (having an average particle diameter of 20 μm) as a brittleness imparting material, a release sheet having a hardness of 70 as measured by a type A durometer was fabricated.

Example 4

A thermally conductive sheet composite of Example 4 was the same as the thermally conductive sheet composite of Example 1, except that a release sheet had a different composition. In Example 4, from 100 parts by mass of the liquid silicone polymer and 50 parts by mass of a talc (having an average particle diameter of 12 μm) as a brittleness imparting material, a release sheet having a hardness of 80 as measured by a type A durometer was fabricated.

Comparative Example 1

A thermally conductive sheet composite of Comparative Example 1 was the same as the thermally conductive sheet composite of Example 1, except that a different release sheet was used. In Comparative Example 1, a PET film having a thickness of about 120 μm was used in place of the release sheet in Example 1.

Comparative Example 2

A thermally conductive sheet composite of Comparative Example 2 was the same as the thermally conductive sheet composite of Example 1, except that a different release sheet was used. In Comparative Example 2, a release sheet made of a silicone rubber containing no brittleness imparting material was used in place of the release sheet in Example 1. The thickness of the release sheet was about 0.5 mm. The release sheet had a hardness of 20 as measured by a type A durometer.
(Evaluation Method)

For Examples 1 to 4 and Comparative Examples 1 and 2, each obtained thermally conductive sheet composite was cut halfway using a commercially available cutter into a 10 mm×10 mm size as shown in FIGS. 4A and 4B. After being cut, the release sheet or the PET film was peeled off the thermally conductive sheet and cut portions of the thermally conductive sheet was visually observed. The results are shown in Table 1 shown below. In column "States of Cut Portions of Thermally Conductive Sheet" of Table 1, GOOD indicates that cut portions were almost not crushed and the cut surface had only a small dimensional error; and BAD indicates that cut portions were crushed and the cut surface had a large dimensional error.

TABLE 1

| Thermally Conductive Sheet Composite | States of Cut Portions of Thermally Conductive Sheet |
| --- | --- |
| Example 1 | GOOD |
| Example 2 | GOOD |
| Example 3 | GOOD |
| Example 4 | GOOD |
| Comparative Example 1 | BAD |
| Comparative Example 2 | BAD |

As shown in Table 1, in Example 1 to Example 4, the thermally conductive sheets together with the release sheets were hardly crushed at their cut portions. Therefore, cut surfaces exhibiting very small dimensional errors and variations in shapes were obtained. Also with respect to ease of cutting, in Example 1 to Example 4, results exhibiting very easy cutting were obtained. By contrast, in Comparative Examples 1 and 2, as shown in FIG. 11B, the thermally conductive sheets together with the release sheets were crushed at their cut portions. Therefore, only cut surfaces exhibiting large errors and variations in dimensional shapes were obtained. Also with respect to ease of cutting, in Comparative Examples 1 and 2, results exhibiting a much difficulty in cutting were obtained. This is supposedly because, in Comparative Example 1, the PET film was used as a release sheet. In Comparative Example 2, this is supposedly because a release sheet having a hardness of about 20 (less than 30) as measured by a type A durometer was used.

Figure 7:
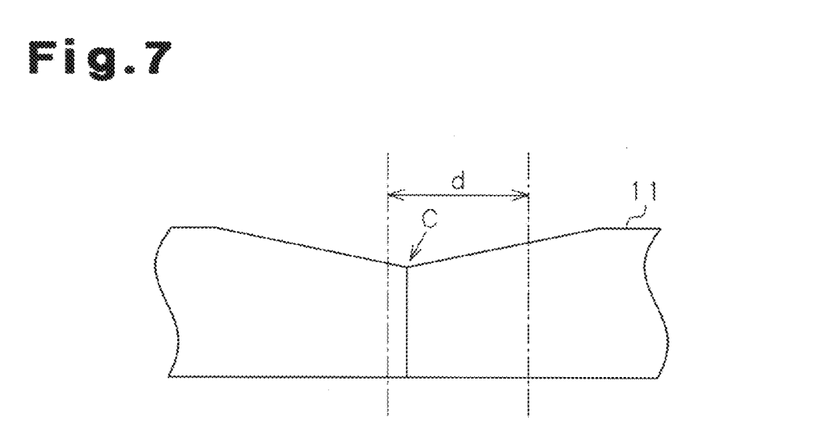
FIG. 7 is a schematic view explaining a method for imaging the vicinity of a cut portion of a thermally conductive sheet.
Figure 8:
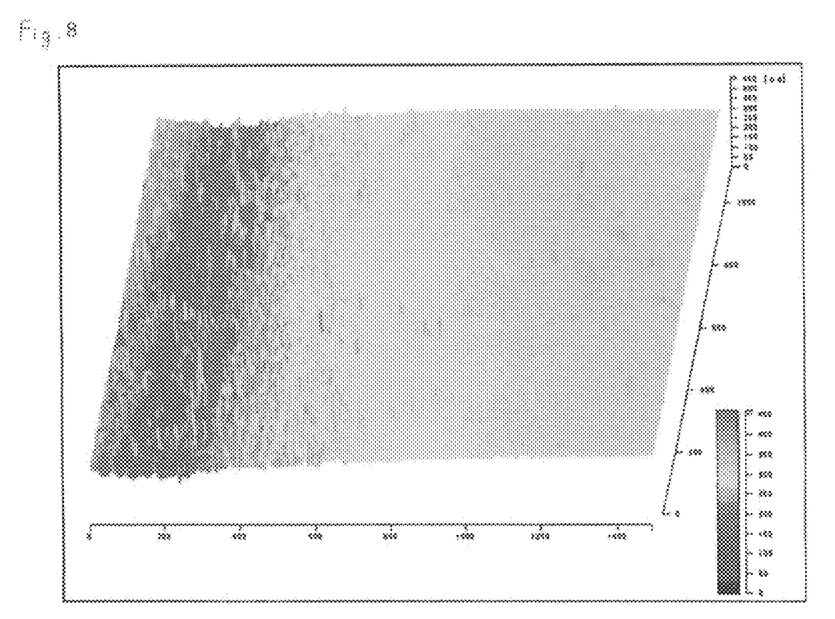
FIG. 8 is image data of the vicinity of a cut surface of a thermally conductive sheet in Example 1.
Figure 9:
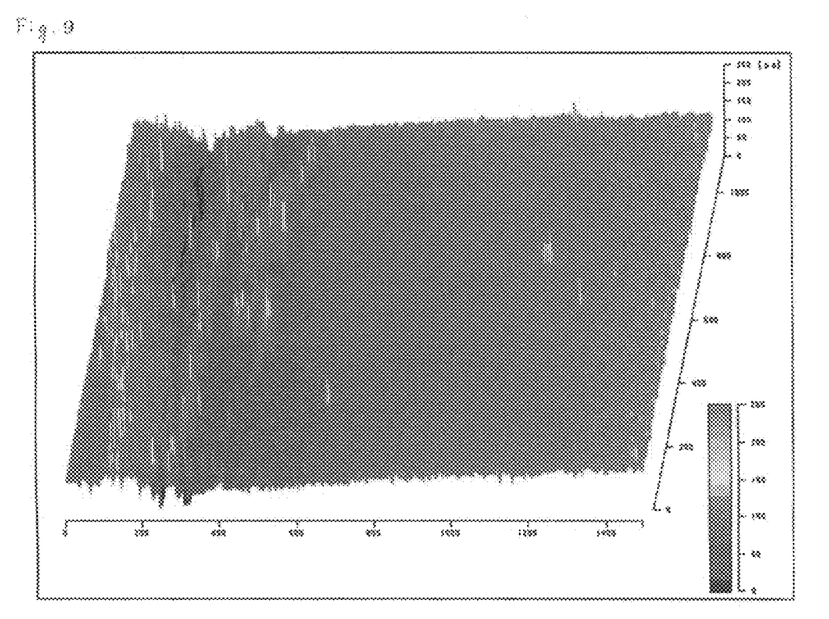
FIG. 9 is image data of the vicinity of a cut portion of a thermally conductive sheet in Example 2.
Figure 10:
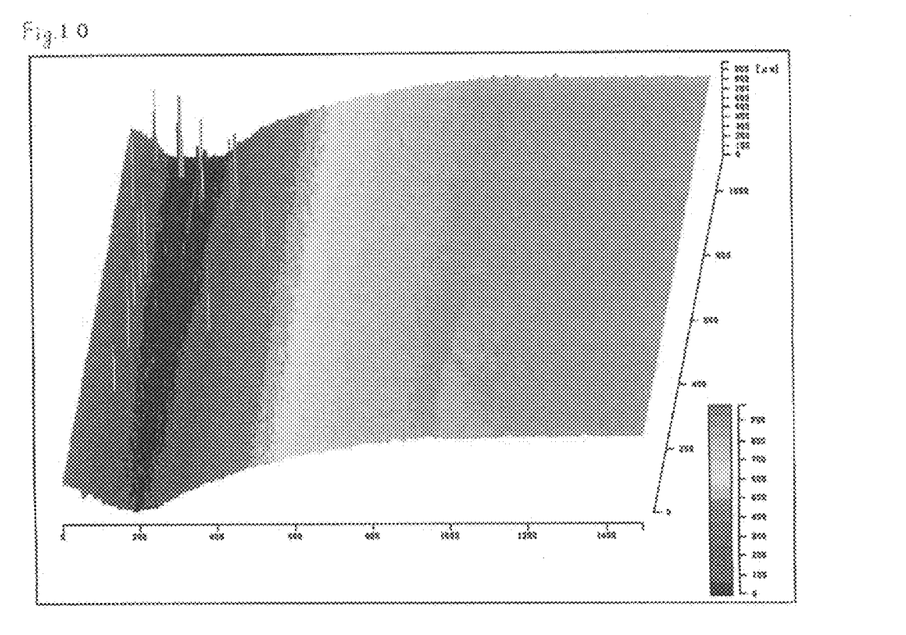
FIG. 10 is image data of the vicinity of a cut portion of a thermally conductive sheet in Comparative Example 2.

In order to examine the results of Table 1 in more detail, cut portions C of the thermally conductive sheets 11 in Examples 1 and 2 and Comparative Example 2 were imaged using an ultra depth shape measuring microscope (made by Keyence Corp., VK8500). Taking the performance limit of the microscope into account, the vicinity of cut portions C of the thermally conductive sheet was imaged in the range d of 1,500 μm containing the cut portions C as shown in FIG. 7. Then, from the obtained image photographs, the depths of portions crushed on cutting of the thermally conductive sheets 11 were respectively compared. In FIGS. 8 to 10, image photographs of the vicinities of cut portions C of the thermally conductive sheets of Examples 1 and 2 and Comparative Example 2 are respectively shown. In each image photograph, the abscissa indicates an axis perpendicular to a cut surface and the ordinate indicates an axis extending along the cut surface. In each image photograph, portions crushed most deeply by cutting are shown at positions of about 200 μm on the abscissa. Comparing the results of Examples 1 and 2 and Comparative Example 2, the thermally conductive sheet in Comparative Example 2 was crushed in deeper and broader ranges centered on the cut portions C than those in Examples 1 and 2. Also from this result, the case of Comparative Example 2 was confirmed to easily cause errors in sizes such as thickness at cut portions of the thermally conductive sheet as compared with the cases of Examples 1 and 2. Further comparing Example 1 and Example 2, the case of Example 1 exhibited a smaller amount of depression by cutting than the case of Example 2. From this result, comparing the release sheet having a type A hardness of 90 and the release sheet having a type A hardness of 30, the use of a release sheet having a higher hardness was confirmed to hardly cause errors in sizes such as thickness at cut portions of the thermally conductive sheet.

Further, the tear strengths of release sheets using Reference Examples 1 to 4 described below were measured.

Reference Example 1

In Reference Example 1, 100 parts by mass of a liquid silicone, CY52-291 and 100 parts by mass of aluminum hydroxide (having an average particle diameter of 50 μm, B53 made by Nippon Light Metal Co., Ltd.) as a brittleness imparting material were kneaded to prepare a polymer composition. 4 parts by mass of a catalyst was added to the obtained polymer composition, and the polymer composition is then primarily and secondarily vulcanized to fabricate a release sheet having a hardness of 42 as measured by a Type A durometer.

Reference Example 2

A release sheet of Reference Example 2 was the same as the release sheet of Reference Example 1, except for the amount of the catalyst added. In Reference Example 2, 1 part by mass of the catalyst was added to the obtained polymer composition to fabricate a release sheet having a hardness of 31 as measured by a type A durometer. The release sheets of Reference Examples 1 and 2 correspond to the release sheet of Example 2 described above.

Reference Example 3

A release sheet of Reference Example 3 was the same as the release sheet of Reference Example 1, except for the amount of the catalyst added. In Reference Example 3, 0.8 part by mass of the catalyst was added to the obtained polymer composition to fabricate a release sheet having a hardness of 20 as measured by a type A durometer.

Reference Example 4

A release sheet of Reference Example 4 was the same as the release sheet of Reference Example 1, except for the amount of the catalyst added. In Reference Example 4, 0.5 part by mass of the catalyst was added to the obtained polymer composition to fabricate a release sheet having a hardness of 1 as measured by a type A durometer. The release sheets of Reference Examples 3 and 4 correspond to the release sheet of Reference Example 2 described above.

<Tear Strength>

For Reference Examples 1 to 4, tear strengths of the release sheets were determined using angle test pieces having no notch in conformity with ISO 7619. The results are shown in Table 2 shown below together with the compositions (parts by mass), hardnesses of type A and type E hardnesses of the release sheets.

TABLE 2

|  | Reference Example 1 | Reference Example 2 | Reference Example 3 | Reference Example 4 |
| --- | --- | --- | --- | --- |
| CY52-291 (parts by mass) | 100 | 100 | 100 | 100 |
| Catalyst (parts by mass) | 4 | 1 | 0.8 | 0.5 |
| Aluminum Hydroxide (parts by mass) | 100 | 100 | 100 | 100 |
| Type A Hardness, ISO 7619 | 42 | 31 | 20 | 1 |
| Type E Hardness, ISO 7619 | 71 | 60 | 48 | 25 |
| Tear Strength (N/cm) | 9.39 | 10.54 | 6.16 | 3.36 |

As shown in Table 2, in Reference Examples 1 and 2, type A hardnesses were not less than 30, and tear strengths were about 10 N/cm. On the other hand, in Reference Examples 3 and 4, type A hardnesses were not more than 20, and tear strengths were not more than 6.2 N/cm. That is, the release sheets of Reference Examples 3 and 4 had lower tear strengths than those of Reference Examples 1 and 2, and were supposedly cut easily. However, although the release sheets of Reference Examples 3 and 4 were easily cut, these correspondingly had lower strengths. The release sheets of Reference Examples 3 and 4 thus had a tendency of being easily crushed at their cut portions and being easily dented. Since the release sheets were crushed at their cut portions, the thermally conductive sheets also had a tendency of being crushed as shown in FIG. 11B. These reasons also substantiate that, in order to easily cut a gelatinous thermally conductive sheet without crushing it at its cut portions, a release sheet having a hardness of 30 or more as measured by a type A durometer should be used, as indicated in Examples 1 to 4 and Comparative Examples 1 and 2.

The invention claimed is:

1. A thermally conductive sheet composite, comprising:
   a gelatinous thermally conductive sheet molded of a thermally conductive polymer composition containing a polymeric material and a thermally conductive filler; and
   a release sheet molded separately from the thermally conductive sheet and peelably laminated on at least one surface of a pair of surfaces of the thermally conductive sheet,
   wherein the release sheet has a hardness of 30 or more as measured by a type A durometer in conformity with ISO 7619,
   wherein the release sheet is formed of a sheet material containing a base material comprising an elastic material and a brittle imparting material to make the base material brittle, and
   wherein the thermally conductive sheet composite is formed in such a manner that the thermally conductive sheet is cut together with the release sheet using a cutting device,
   wherein the brittle imparting material comprises inorganic particles or organic particles, and
   wherein the particle diameter of the brittle imparting material is in the range of 12 μm to 50 μm.

2. The thermally conductive sheet composite according to claim 1, wherein a pair of surfaces of the thermally conductive sheet are a first surface and a second surface opposed to each other, wherein the release sheet is peelably laminated on the first surface of the thermally conductive sheet, and wherein a reinforcing sheet that reinforces the thermally conductive sheet is peelably laminated on the second surface of the thermally conductive sheet.

3. The thermally conductive sheet composite according to claim 2, wherein the thermally conductive sheet comprises a plurality of layers, and one of the plurality of layers that is adjacent to the reinforcing sheet is rubbery.

4. The thermally conductive sheet composite according to claim 1, wherein the release sheet is provided on each of both surfaces of the thermally conductive sheet.

* * * * *